(12) United States Patent
Shibata et al.

(10) Patent No.: US 10,529,843 B2
(45) Date of Patent: Jan. 7, 2020

(54) SEMICONDUCTOR DEVICE

(71) Applicant: PANASONIC CORPORATION, Osaka (JP)

(72) Inventors: Daisuke Shibata, Kyoto (JP); Satoshi Tamura, Osaka (JP); Masahiro Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 16/056,954

(22) Filed: Aug. 7, 2018

(65) Prior Publication Data

US 2018/0350965 A1   Dec. 6, 2018

Related U.S. Application Data

(63) Continuation of application No. PCT/JP2017/004315, filed on Feb. 7, 2017.

(30) Foreign Application Priority Data

Feb. 12, 2016 (JP) ................................. 2016-024278

(51) Int. Cl.
  *H01L 29/778*  (2006.01)
  *H01L 29/10*  (2006.01)
  *H01L 29/417*  (2006.01)

(52) U.S. Cl.
  CPC ...... *H01L 29/7788* (2013.01); *H01L 29/1095* (2013.01); *H01L 29/7787* (2013.01); *H01L 29/41741* (2013.01)

(58) Field of Classification Search
  CPC ........... H01L 29/7789; H01L 29/41766; H01L 29/7787; H01L 29/778; H01L 29/7788
  See application file for complete search history.

(56) References Cited

U.S. PATENT DOCUMENTS

| 2011/0108911 A1 | 5/2011 | Matsuoka |
| 2011/0204381 A1 | 8/2011 | Okada et al. |

(Continued)

FOREIGN PATENT DOCUMENTS

| JP | 2009-272586 A | 11/2009 | |
| JP | 2009272586 A * | 11/2009 | ......... H01L 29/7788 |

(Continued)

OTHER PUBLICATIONS

International Search Report issued in Application No. PCT/JP2017/004315 dated May 16, 2017, with English translation.

*Primary Examiner* — Charles D Garber
*Assistant Examiner* — Alia Sabur
(74) *Attorney, Agent, or Firm* — McDermott Will & Emery LLP

(57) ABSTRACT

A semiconductor device includes: a substrate; a drift layer which is disposed on the substrate and has a groove; an underlayer which is disposed above the drift layer; a first opening which penetrates the underlayer to reach the drift layer; an electron transit layer and an electron supply layer which are disposed to cover the first opening; a second opening which penetrates the electron supply layer and the electron transit layer to reach the underlayer; a gate electrode which is disposed above the electron supply layer at a position corresponding to a position of the first opening; a source electrode which is disposed to cover the second opening and in contact with the underlayer; and a drain electrode which is disposed on a backside surface of the substrate. A bottom surface of the groove is closer to the substrate than a bottom surface of the first opening.

7 Claims, 11 Drawing Sheets

(56) References Cited

U.S. PATENT DOCUMENTS

| | | | |
|---|---|---|---|
| 2012/0181548 A1* | 7/2012 | Okada | H01L 29/7786 |
| | | | 257/76 |
| 2014/0264563 A1* | 9/2014 | Cheng | H01L 29/7827 |
| | | | 257/330 |
| 2016/0329421 A1 | 11/2016 | Shibata et al. | |

FOREIGN PATENT DOCUMENTS

| | | |
|---|---|---|
| JP | 2011-035072 A | 2/2011 |
| JP | 2011-100877 A | 5/2011 |
| JP | 2012-084617 A | 4/2012 |
| WO | 2015/122135 A1 | 8/2015 |

* cited by examiner

SEMICONDUCTOR DEVICE

CROSS REFERENCE TO RELATED APPLICATIONS

This application is a U.S. continuation application of PCT International Patent Application Number PCT/JP2017/004315 filed on Feb. 7, 2017, claiming the benefit of priority of Japanese Patent Application Number 2016-024278 filed on Feb. 12, 2016, the entire contents of which are hereby incorporated by reference.

BACKGROUND

1. Technical Field

The present disclosure relates to a semiconductor device which functions as a transistor.

2. Description of the Related Art

A semiconductor device, such as a transistor, that is formed from a nitride semiconductor expressed by a general formula $Al_xGa_{1-x-y}In_yN$ (where $0 \leq x \leq 1$, $0 \leq y \leq 1$) has a low on-resistance, a high breakdown voltage, and excellent pinch-off characteristics. On this account, expectations are growing that a transistor formed from a nitride semiconductor can be used as a power transistor in, for example, a power supply circuit of a television set or other consumer equipment. As an example of such a transistor, a vertical transistor disclosed in Japanese Unexamined Patent Application Publication No. 2012-84617 (PTL 1) is known, for instance.

FIG. 16 is a cross-sectional view of conventional semiconductor device 100 disclosed in PTL 1. Semiconductor device 100 includes substrate 101, drift layer 104 formed from n-type GaN, barrier layer 106 formed from p-type GaN, source electrode S, drain electrode D, and gate electrode G. Semiconductor device 100 further includes channel layer 122 formed from GaN and electron supply layer 126 formed from AlGaN. Channel layer 122 and electron supply layer 126 are formed to cover a gate groove which penetrates barrier layer 106 to reach drift layer 104. Source electrode S is in contact with both channel layer 122 and barrier layer 106. Gate electrode G is formed to cover the gate groove. Drain electrode D is formed on a backside surface of substrate 101. Insulation layer 109 is formed between gate electrode G and electron supply layer 126.

SUMMARY

When the transistor is applied to, for example, an inverter, this means that the transistor is switched on and off with an inductive load. When the transistor is turned off, energy stored in the inductive load ($E=\frac{1}{2}*LI^2$, where L is self-inductance and I is current) needs to be consumed within a circuit. Here, avalanche energy capacity is an index of fracture resistance of the transistor at the time of energy consumption. The avalanche energy capacity is defined as a maximum energy that can be consumed without causing fracture to the transistor when the energy stored in the inductive load is consumed by the transistor. Here, since the transistor needs to pass a current from drain electrode D to source electrode S in an off state, this energy is inevitably consumed using an avalanche region of the transistor.

Hereinafter, the avalanche energy capacity of conventional semiconductor device (transistor) 100 shown in FIG. 16 is discussed. In conventional semiconductor device 100, a distance from a bottom of the gate groove to drain electrode D is shorter than a distance from an interface between barrier layer 106 and drift layer 104 to drain electrode D. For this reason, electric field concentration occurs to the gate groove and, in particular, an end portion of the gate groove. Thus, an avalanche breakdown occurs to the gate groove, and an avalanche current passes from drain electrode D to source electrode S through channel layer 122.

Channel layer 122 forms a two-dimensional electron gas layer generated at an interface between an AlGaN layer and a GaN layer. The two-dimensional electron gas layer has almost no thickness (the thickness is generally believed to be a few nanometers). Thus, a large amount of energy stored in the inductive load is consumed in the two-dimensional electron gas layer that has almost no thickness. As a result, energy density of channel layer 122 is remarkably increased, thereby causing a local elevation of temperature. This leads to fracture of the transistor. Hence, a problem of the conventional transistor is a low avalanche energy capacity.

In view of the aforementioned problem, the present disclosure has an object to provide a semiconductor device which has a high avalanche energy capacity and a high breakdown voltage.

To solve the aforementioned problem, a semiconductor device according to an aspect of the present disclosure includes: a substrate which has a first main surface on one side and a second main surface on an opposite side, and which is of a first conductivity type; a drift layer which is disposed on the first main surface of the substrate, has a groove in a partial region, and includes a first nitride semiconductor that is of the first conductivity type; an underlayer which is disposed above the drift layer; a first opening which is disposed separately from the groove in plan view and penetrates the underlayer to reach the drift layer; an electron transit layer which is disposed to cover the first opening and includes a second nitride semiconductor; an electron supply layer which is disposed above the electron transit layer and includes a third nitride semiconductor having a larger band gap than the second nitride semiconductor; a channel layer which is disposed inside the electron transit layer and near an interface between the electron transit layer and the electron supply layer; a second opening which penetrates the electron supply layer and the electron transit layer to reach the underlayer; a gate electrode which is disposed above the electron supply layer at a position corresponding to a position of the first opening; a source electrode which is disposed to cover the second opening, located separately from the gate electrode, and in contact with the channel layer and the underlayer; and a drain electrode which is disposed on the second main surface of the substrate. A bottom surface of the groove is closer to the first main surface of the substrate than a bottom surface of the first opening.

With this configuration, the distance from the bottom surface of the groove, which is located straight down from the source electrode, to the substrate is shorter than the distance from the bottom surface of the first opening, which is located straight down from the gate electrode, to the substrate. As a result, the electric field concentration straight down from the gate electrode can be reduced, and the avalanche current can flow between the drain electrode and the source electrode.

The present disclosure can provide a semiconductor device which has a high avalanche energy capacity and a high breakdown voltage.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Figure 1:
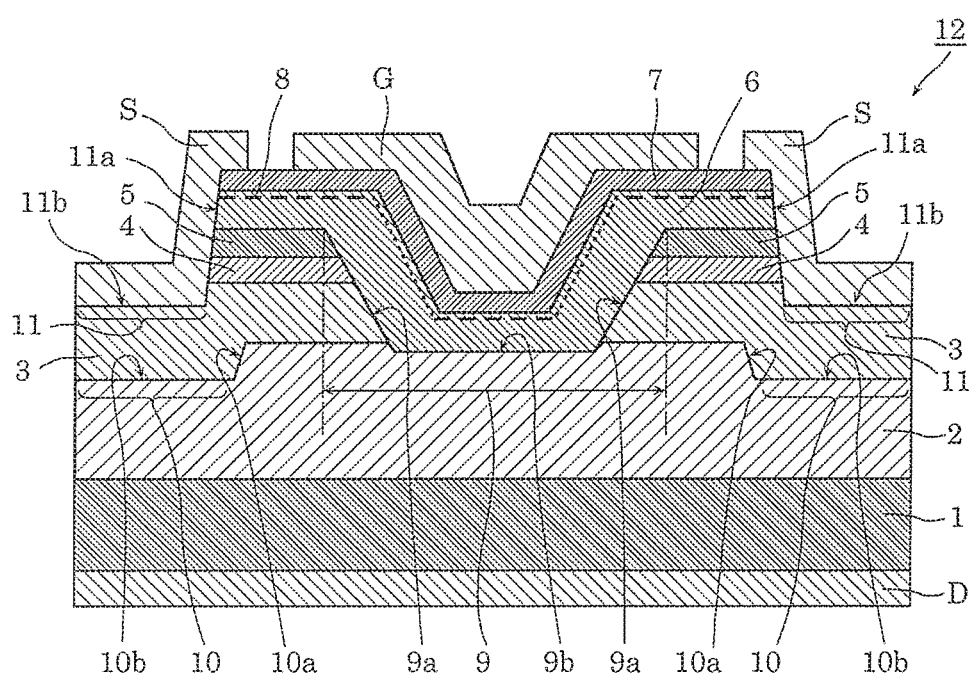
FIG. 1 is a cross-sectional diagram of a semiconductor device according to Embodiment 1 of the present disclosure.

Hereinafter, exemplary embodiments of a semiconductor device according to the present disclosure are described in detail with reference to the accompanying drawings. It should be noted that each of the exemplary embodiments below describes only a preferred specific example. Therefore, the numerical values, shapes, materials, structural elements, the arrangement and connection of the structural elements, steps, the processing order of the steps, and so forth described in the following exemplary embodiments are merely examples, and are not intended to limit the present disclosure. Thus, among the structural elements in the following exemplary embodiments, structural elements that are not recited in any one of the independent claims indicating top concepts according to the present disclosure are described as arbitrary structural elements.

Note that each of the drawings is only a schematic diagram and is not necessarily precise illustration. Thus, the reduction scales and the like in the drawings do not always agree with each other. Note also that, in all the drawings, the same reference numerals are given to the substantially same structural elements and redundant description thereof shall be omitted or simplified. Moreover, the term "approximately" as in "approximately parallel" is used in the embodiments described below. For example, the meaning of the term "approximately parallel" includes not only "completely parallel" but also "substantially parallel". More specifically, the meaning of this term includes a case where a small percent difference is present with respect to the "completely parallel" state. The same applies to the other terms using "approximately" in the embodiments described below.

Furthermore, the terms "upward" and "downward" are used in the present specification. Note that these terms do not refer to an upward direction (vertically upward) and a downward direction (vertically downward) in an absolute space recognition. More specifically, these terms in the present specification are defined depending on a relative position relationship based on an order in which layers are laminated in a laminate structure. Note also that the terms "upward" and "downward" are used not only in the case where two structural elements are disposed to leave a space between these elements so that a different structural element is present between the two structural elements, but also in the case where the two structural elements are disposed to be in absolute contact with each other.

Moreover, AlGaN described in the present specification refers to a three-element mixed crystal of $Al_xGa_{1-x}N$ (where x is a value expressed by $0 \leq x \leq 1$). In the following description, a multi-element mixed crystal is abbreviated by a sequence of symbols of the constituent elements, such as AlInN or GaInN. For example, a nitride semiconductor of $Al_xGa_{1-x-y}In_yN$ (where x and y are values expressed by $0 \leq x \leq 1$, $0 \leq y \leq 1$, and $0 \leq x+y \leq 1$) is abbreviated as AlGaInN.

Embodiment 1

The following describes a semiconductor device according to Embodiment 1 of the present disclosure, with reference to the accompanying drawings.

[Configuration and Manufacturing Method]

FIG. 1 is a cross-sectional diagram of semiconductor device 12 according to the present embodiment.

As shown in FIG. 1, semiconductor device 12 according to the present embodiment includes; substrate 1 which is formed from n-type GaN; and drift layer 2 which is formed from n-type GaN and disposed on a main surface of substrate 1. Groove 10 is formed in a part of drift layer 2.

Semiconductor device 12 further includes first underlayer 3, block layer 4, and second underlayer 5 which are formed sequentially above drift layer 2. Semiconductor device 12 further includes gate opening 9 which penetrates second underlayer layer 5, block layer 4, and first underlayer 3 to reach drift layer 2. Gate opening 9 is an example of a first opening.

Semiconductor device 12 further includes: first regrown layer 6 which is an example of an electron transit layer; and second regrown layer 7 which is an example of an electron supply layer. First regrown layer 6 and second regrown layer 7 are formed in this order to cover gate opening 9. First regrown layer 6 includes two-dimensional electron gas layer 8 formed as a channel, near an interface between first regrown layer 6 and second regrown layer 7. Semiconductor device 12 further includes gate electrode G which is formed on second regrown layer 7 and disposed at a position corresponding to a position of gate opening 9.

Semiconductor device 12 further includes source opening 11 which is disposed at a position corresponding to a position of groove 10 and penetrates second regrown 7, first regrown layer 6, second underlayer layer 5, and block layer 4 to reach first underlayer 3. Source opening 11 is an example of a second opening. Moreover, semiconductor device 12 includes source electrode S which is formed to cover source opening 11 and in contact with first underlayer 3 and second regrown layer 7. Furthermore, semiconductor device 12 includes drain electron D which is formed on a backside surface of substrate 1. As described above, semiconductor device 12 according to the present embodiment is a so-called vertical field-effect transistor.

Gate opening 9 and groove 10 are disposed separately from each other in plan view. Source electrode S and gate electrode G are disposed separately from each other in plan view. Moreover, source electrode S is in contact with two-dimensional electron gas layer 8 on a side surface of source opening 11. It should be noted that an example of a plan layout of a chip including semiconductor device 12 is described in Embodiment 5 below.

In the present embodiment, bottom surface 10b of groove 10 is closer to the main surface of substrate 1 than bottom surface 9b of gate opening 9. To be more specific, an interface located straight down from source electrode S in groove 10 between drift layer 2 and first underlayer layer 3 is closer to the main surface of substrate 1 than an interface located straight down from gate electrode G in gate opening 9 between drift layer 2 and first regrown layer 6.

Hereinafter, a specific configuration is described in detail for each of the layers (each of members) included in semiconductor device 12.

Substrate 1 has a first main surface on one side and a second main surface on an opposite side, and is of a first conductivity type. On the first main surface, drift layer 2 is formed. The first main surface has plane orientation in the [0001] plane (that is, c-plane). On the second main surface (the backside surface), drain electrode D is formed. In the present embodiment, the first conductivity type refers to the $n^+$ type. To be more specific, an excessive amount of n-type dopant is added to substrate 1 (substrate 1 is of the so-called $n^+$ type).

It should be noted that "p-type" and "n-type" refer to conductivity types of semiconductor layers. Here, $n^+$ represents a so-called heavily doped state in which an excessive amount of n-type dopant is added to the semiconductor layer. Moreover, $n^-$ represents a so-called lightly doped state in which an excessively small amount of n-type dopant is added to the semiconductor layer. Opposite-conductivity types of n-type, $n^+$ type, and $n^-$ type are p-type, $p^+$ type, and $p^-$ type.

Drift layer 2 is disposed on the first main surface, and is an example of a nitride semiconductor layer formed from a first nitride semiconductor which is of the first conductivity type. For example, drift layer 2 has a thickness of 8 μm and is formed from n-type conductive GaN. Drift layer 2 is formed on the first main surface of substrate 1 by crystal growth, for example. The crystal growth is achieved by, for example, an organometallic vapor-phase epitaxy (MOVPE) method. It should be noted that first underlayer 3, block layer 4, and second underlayer 5 are formed by this method as well.

A donor concentration of drift layer 2 is a predetermined value within a range from $1*10^{15}$ cm$^{-3}$ to $1*10^{17}$ cm$^{-3}$ inclusive, for example. Moreover, a carbon (C) concentration of drift layer 2 is a predetermined value within a range from $1*10^{15}$ cm$^{-3}$ to $2*10^{17}$ cm$^{-3}$ inclusive.

In the present embodiment, drift layer 2 includes groove 10. Groove 10 is formed by partially removing drift layer 2 to a predetermined depth from an upper surface of drift layer 2. For example, groove 10 is formed by removing a predetermined region of drift layer 2 in plan view by dry etching.

Groove 10 has: side surface 10a inclined with respect to the first main surface of substrate 1; and bottom surface 10b approximately parallel to the first main surface of substrate 1. Note that side surface 10a may be perpendicular to the first main surface of substrate 1. Bottom surface 10b of groove 10 is disposed closer to the first main surface of substrate 1 than bottom surface 9b of gate opening 9. To be more specific, a distance from bottom surface 10b to the first main surface of substrate 1 is shorter than a distance from bottom surface 9b to the first main surface of substrate 1. In the present embodiment, the depth of groove 10 is greater than the depth of gate opening 9 in drift layer 2.

The position of groove 10 is different from a position of gate electrode G (or gate opening 9) in plan view. More specifically, the position of groove 10 overlaps a position of source electrode S in plan view. Groove 10 is formed separately from gate opening 9 and located straight down from source electrode S.

First underlayer 3 is formed above drift layer 2. In the present embodiment, first underlayer 3 is formed on drift layer 2. More specifically, first underlayer 3 is formed on the upper surface of drift layer 2 and on side surface 10a and bottom surface 10b of groove 10.

First underlayer 3 is a nitride semiconductor layer formed from a fifth nitride semiconductor which is of a second conductivity type opposite to the first conductivity type. For example, first underlayer 3 has a thickness of 400 nm and is formed from p-type conductive GaN.

First underlayer 3 having p-type conductivity is formed by crystal growth of Mg-doped GaN, for example. First underlayer 3 may be formed by firstly forming undoped GaN (intrinsic GaN, referred to as i-GaN hereinafter) and then performing ion implantation of Mg into i-GaN.

It should be noted that first underlayer 3 is not limited to the p-type layer and may be semi-insulating or insulating. To allow first underlayer 3 to be semi-insulating or insulating, iron (Fe) may be added to first underlayer 3, for example.

Block layer 4 is disposed between first regrown layer (electron transit layer) 6 and first underlayer 3. More specifically, block layer 4 is disposed on first underlayer 3. Block layer 4 is formed from an insulating or semi-insulating nitride semiconductor. For example, block layer 4 has a thickness of 200 nm and is formed from n-type conductive GaN. Block layer 4 has a carbon (C) concentration of at least $3*10^{17}$ cm$^{-3}$, for example. Alternatively, the carbon (C) concentration of block layer 4 may be at least $1*10^{18}$ cm$^{-3}$.

Block layer 4 may be formed from any insulating or semi-insulating material. In this case a concentration of silicon (Si) or oxygen (O) which is an n-type impurity included in block layer 4 is lower than the carbon (C) concentration. The silicon or oxygen concentration is $5*10^{16}$ cm$^{-3}$ or lower, for example. Alternatively, the silicon or oxygen concentration may be $2*10^{16}$ cm$^{-3}$ or lower. Note that block layer 4 may be formed by ion implantation of magnesium (Mg), iron (Fe), or boron (B) into i-GaN. The ion type used in the ion implantation may be any type, other than the above type, that can achieve high resistivity of i-GaN.

Block layer 4 can suppress an occurrence of a parasitic npn structure, and thus can reduce influence of a malfunction caused by the parasitic npn structure. Suppose that semiconductor device 12 does not include block layer 4. In this case, the following laminated structure is disposed, between source electrode S and drain electrode D. The layers in the laminated structure are disposed in the following order from top to bottom; second regrown layer 7; first regrown layer 6; second underlayer 5 (n-type); first underlayer 3 (p-type); and drift layer 2 (n-type). Here, first regrown layer 6 and second regrown layer 7 are formed by a crystal regrowth method. This laminated structure is a parasitic npn structure (a parasitic bipolar transistor). When semiconductor device 12 is in an off state and a current passes through first underlayer 3, this parasitic bipolar transistor may be turned on and then reduce the breakdown voltage of semiconductor device 12. This causes semiconductor device 12 to be susceptible to malfunctions. However, when an influence of the parasitic bipolar transistor is sufficiently small, semiconductor device 12 may not need to include block layer 4.

Second underlayer 5 is disposed between first regrown layer (electron transit layer) 6 and first underlayer 3. To be more specific, second underlayer 5 is a nitride semiconductor layer disposed on block layer 4. For example, second underlayer 5 has a thickness of 20 nm and is formed from AlGaN having an Al composition of 0.2 (i.e., Al$_{0.2}$Ga$_{0.8}$N). Second underlayer 5 has a function of suppressing diffusion of impurity, such as p-type impurity (Mg, for example), from first underlayer 3.

It should be noted that the Al composition of second underlayer 5 is not limited to 0.2 and may be a different Al composition. For example, second underlayer 5 may have the Al composition in a range from 0.12 to 0.30 inclusive.

In the present embodiment, gate opening 9 having a recessed shape is formed to penetrate, from an upper surface of second underlayer 5, second underlayer 5, block layer 4, and first underlayer 3 to reach drift layer 2, as shown in FIG. 1. The position of gate opening 9 is different from the position of groove 10 in plan view.

Gate opening 9 has: side surface 9a inclined with respect to the first main surface of substrate 1; and bottom surface 9b approximately parallel to the first main surface of substrate 1. Gate opening 9 is formed so that an opening area of gate opening 9 increases with distance from substrate 1. Gate opening 9 has an inverted trapezoidal shape in cross section, for example.

After the layers from drift layer 2 (groove 10 is formed after drift layer 2 is formed) to second underlayer 5 are formed sequentially on the first main surface of substrate 1, gate opening 9 is formed by etching second underlayer 5, block layer 4, and first underlayer 3 so that drift layer 2 is partially exposed. Gate opening 9 is formed in a predetermined shape by patterning using photolithography or by dry etching, for example.

First regrown layer 6 is formed to cover gate opening 9, and is an example of an electron transit layer formed from a second nitride semiconductor. For example, first regrown layer 6 has a thickness of 100 nm and is formed from GaN. A film thickness of first regrown layer 6 is approximately uniform. Thus, first regrown layer 6 is formed to have a recess along the surface of gate opening 9.

To be more specific, first regrown layer 6 is disposed to be in contact with the upper surface of second underlayer 5 and side surface 9a and bottom surface 9b of gate opening 9. To be even more specific, first regrown layer 6 is in contact with each of side surfaces of second underlayer 5, block layer 4, and first underlayer 3 in gate opening 9 and also in contact with a surface of drift layer 2 that is exposed to gate opening 9 (i.e., bottom surface 9b of gate opening 9).

Second regrown layer 7 is formed above first regrown layer 6. Second regrown layer 7 is an example of an electron supply layer formed from a third nitride semiconductor that has a larger band gap than the second nitride semiconductor included in first regrown layer 6. More specifically, second regrown layer 7 is disposed on first regrown layer 6. For example, second regrown layer 7 includes: a first layer having a thickness of 1 nm and formed from AlN; and a second layer having a thickness of 50 nm and formed from AlGaN having the Al composition of 0.2.

It should be noted that the Al composition of AlGaN of the second layer included in second regrown layer 7 is not limited to 0.2 and may be a different Al composition. Second regrown layer 7 may have the Al composition in a range from 0.12 to 0.30 inclusive.

The first layer formed from AlN is in contact with first regrown layer 6. Two-dimensional electron gas layer 8 is formed as the channel, near an interface between the first layer formed from AlN and first regrown layer 6, or more specifically, near an interface of first regrown layer 6 with the first layer formed from AlN.

Two-dimensional electron gas layer 8 is an example of a channel layer formed inside first regrown layer (electron transit layer) 6 near the interface between first regrown layer 6 and second regrown layer 7. During a normal operation of semiconductor device 12, a current passes through two-dimensional electron gas layer 8.

After gate opening 9 is formed, first regrown layer 6 and second regrown layer 7 are formed to cover gate opening 9 by the crystal regrowth method. The crystal regrowth is achieved by, for example, the organometallic vapor-phase epitaxy (MOVPE) method.

In the present embodiment, source opening (second opening) 11 is formed to penetrate, from the upper surface of second regrown layer 7, second regrown layer 7, first regrown layer 6, second underlayer 5, and block layer 4 to reach first underlayer 3, as shown in FIG. 1.

Source opening 11 has: side surface 11a inclined with respect to the first main surface of substrate 1; and bottom surface 11b approximately parallel to the first main surface of substrate 1. Note that side surface 11a may be perpendicular to the first main surface of substrate 1. A cross-sectional shape of source opening 11 is an inverted trapezoid, for example, and is not limited to this.

Gate electrode G is disposed above second regrown layer 7 and formed in a position corresponding to the position of gate opening 9. To be more specific, gate electrode G is formed on second regrown layer 7 along the recessed shape of gate opening 9.

Gate electrode G is formed using a conducting material, such as metal. For example, gate electrode G is formed using a material that forms a Schottky contact with a nitride semiconductor having n-type conductivity. Examples of such material include nickel (Ni), an alloy or compound that includes Ni (i.e., a so-called Ni-based material), tungsten silicide (WSi), and gold (Au). For example, gate electrode G is formed by patterning a conductive film that is formed by sputtering or evaporation.

Source electrode S is formed to cover source opening 11, and is disposed separately from gate electrode G. Source electrode S is in contact with two-dimensional electron gas layer (channel layer) 8 and first underlayer 3. To be more specific, source electrode S is formed to cover a part of second regrown layer 7, a whole of side surface Ha of source opening 11, and a whole of bottom surface 11b of source opening 11. More specifically, source electrode S is in contact with second regrown layer 7, first regrown layer 6, second underlayer 5, and block layer 4, on side surface 11a of source opening 11.

Source electrode S is formed using a conducting material, such as metal. For instance, source electrode S can be formed using a material that forms an ohmic contact with an n-type conductive nitride semiconductor, such as Ti/Al. For example, source electrode S is formed by patterning a conductive film that is formed by sputtering or evaporation.

Drain electrode D is disposed on the second main surface (the backside surface) of substrate 1. Drain electrode D is formed using a conducting material, such as metal. For instance, drain electrode D can be formed using a material that forms an ohmic contact with an n-type conductive nitride semiconductor. For example, drain electrode D is formed from a conductive film by sputtering or evaporation.

[Avalanche Energy Capacity]

Here, a substantial enhancement in the avalanche energy capacity of semiconductor device 12 according to the present embodiment is described, with reference to FIG. 2A, FIG. 2B, FIG. 3A, and FIG. 3B.

Figure 2A:
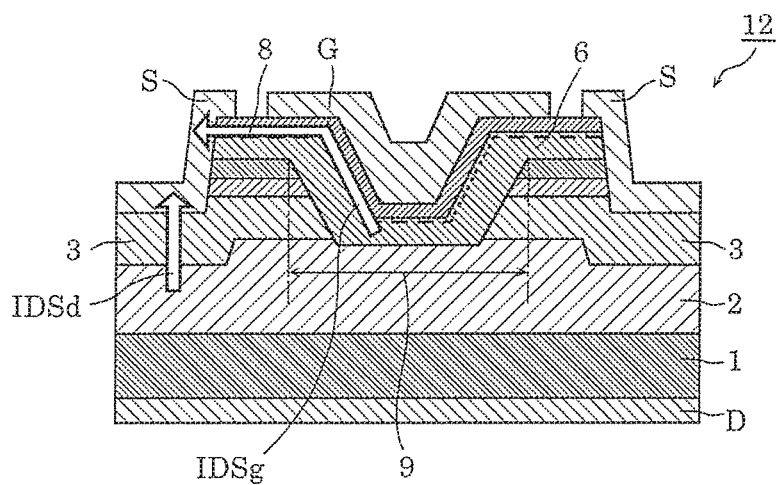
FIG. 2A is a cross-sectional diagram of a current path running through the semiconductor device according to Embodiment 1 of the present disclosure.
Figure 2B:
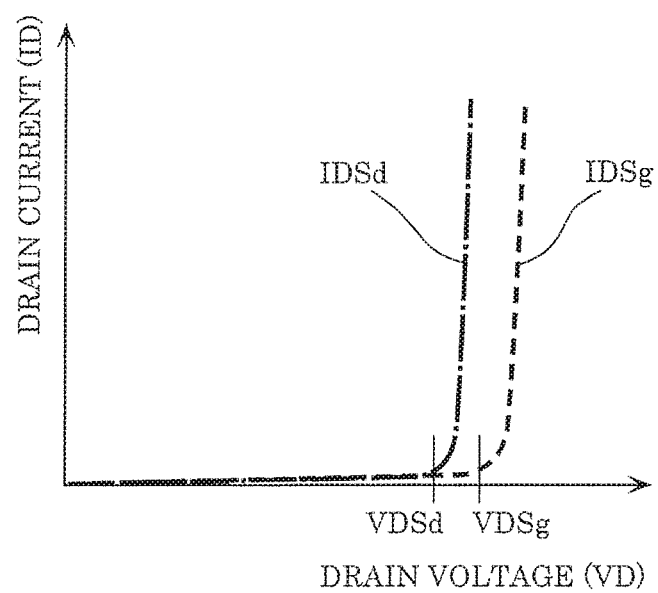
FIG. 2B is a diagram showing a relationship between drain current and drain voltage of the semiconductor device according to Embodiment 1 of the present disclosure.

FIG. 2A is a cross-sectional diagram of a current path running through semiconductor device 12 according to the present embodiment. FIG. 2B is a diagram showing a relationship between drain current ID and drain voltage VD of semiconductor device 12 according to the present embodiment. More specifically, FIG. 2B is a diagram showing, when a voltage is applied between source electrode S and drain electrode D, a relationship between a current passing through drain electrode D (drain current ID) and an applied voltage (i.e., drain voltage VD).

Figure 3A:
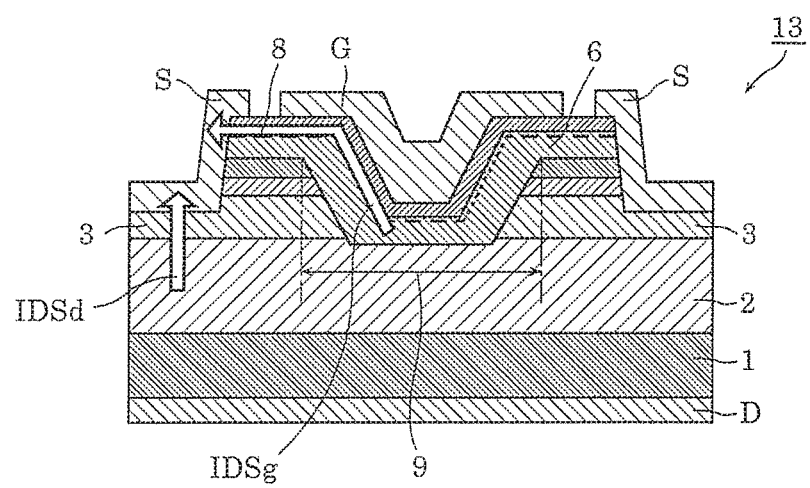
FIG. 3A is a cross-sectional diagram showing a current path running through a semiconductor device according to a comparative example.
Figure 3B:
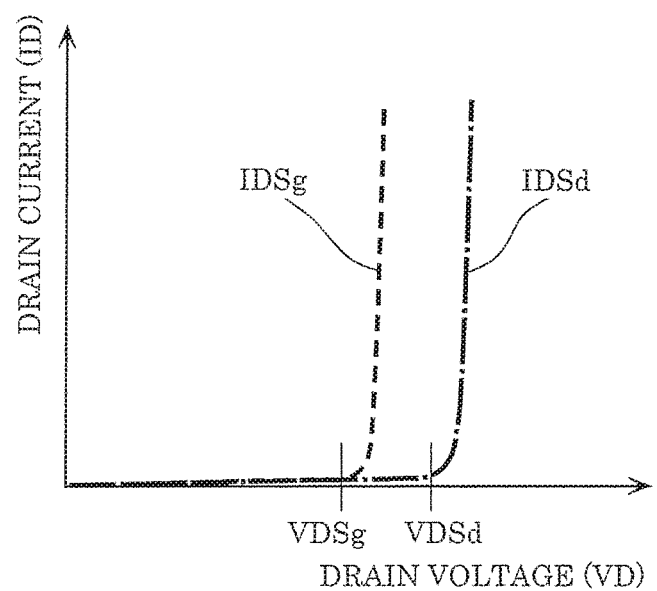
FIG. 3B is a diagram showing a relationship between drain current and drain voltage of the semiconductor device according to the comparative example.

Moreover, a comparative example is described based on semiconductor device 13 which includes drift layer 2 that does not have groove 10. FIG. 3A is a cross-sectional diagram showing a current path running through semiconductor device 13 according to the comparative example. FIG. 3B is a diagram showing a relationship between drain current ID and drain voltage VD of semiconductor device 13 according to the comparative example.

Each of FIG. 2A, FIG. 2B, FIG. 3A, and FIG. 3B shows a case where a voltage is applied between source electrode S and drain electrode D. In each of these diagrams, IDSg indicates a current which is included in drain current ID and which flows from drain electrode D to source electrode S via two-dimensional electron gas layer 8 located straight down from gate opening 9. Moreover, IDSd indicates a current; which flows from drain electrode D to source electrode S via first underlayer 3. Note that an open arrow shown in FIG. 2A and FIG. 3A indicates a direction in which electrons flow, and that the current flows in a direction opposite to the direction of the arrow. Furthermore, in FIG. 2B and FIG. 3B, VDSg indicates a drain voltage at which IDSg starts flowing, and VDSd indicates a voltage at which IDSd starts flowing.

It should be noted that, in FIG. 2A and FIG. 3A, some of the numerical values indicating the layers are omitted for the sake of brevity.

As can be seen from the graphs in FIG. 2B and FIG. 3B, after the drain voltage exceeds VDSg, IDSg increases sharply. Moreover, after the drain voltage exceeds VDSd, IDSd increases sharply. These sharply increased currents are called avalanche currents, and VDSg and VDSd are called breakdown voltages.

As shown in FIG. 2B, semiconductor device 12 according to the present embodiment has VDSg larger than VDSd. In other words, according to semiconductor device 12, a breakdown voltage with respect to current IDSg that passes via two-dimensional electron gas layer 8 located straight down from gate opening 9 is larger than a breakdown voltage with respect to current IDSd that passes through first underlayer 3 located straight down from source electrode S. This means that when drain voltage VD of semiconductor device 12 is increased, a breakdown occurs between first underlayer 3 and drain electrode D located straight down from source electrode S and thus the avalanche current flows.

Semiconductor device 12 according to the present embodiment includes drift layer 2 having groove 10 that is located straight down from source electrode S. Moreover, bottom surface 10b of groove 10 is closer to substrate 1 than bottom surface 9b of gate opening 9. To be more specific, a partial thickness of drift layer 2 straight down from source electrode S (source opening 11) is smaller than a partial thickness of drift layer 2 straight down from gate electrode G (gate opening 9). On this account, the electric field concentration straight down from gate electrode G can be reduced, thereby allowing current IDSd to flow more easily than current IDSg. Hence, current IDSd flows at voltage VDSd that is lower than voltage VDSg at which current IDSg flows.

On the other hand, as shown in FIG. 3B, semiconductor device 13 according to the comparative example has VDSd larger than VDSg. In other words, according to semiconductor device 13, a breakdown voltage with respect to current IDSd that passes through first underlayer 3 located straight down from source electrode S is larger than a breakdown voltage with respect to current IDSg that passes via two-dimensional electron gas layer 8 located straight down from gate opening 9. This means that when drain voltage VD of semiconductor device 13 is increased, a breakdown occurs via two-dimensional electron gas layer 8 located straight down from gate opening 9 and thus the avalanche current flows.

Here, suppose that current IDSg flows from source electrode S to drain electrode D via two-dimensional electron gas layer 8 located straight down from gate opening 9. Two-dimensional electron gas layer 8 has a thickness smaller than a length of a p-n junction between drift layer 2 and first underlayer 3. For this reason, a current path of two-dimensional electron gas layer 8 is smaller than a current path of the p-n junction between drift layer 2 and first underlayer 3. Thus, when the amount of current IDSd is equal to that of current IDSg, a current density of current IDSg passing through two-dimensional electron gas layer 8 is greater than a current density of current IDSd passing through the p-n junction between drift layer 2 and first underlayer 3. In this case, an energy density of two-dimensional electron gas layer 8 is greater than an energy density of the p-n junction between drift layer 2 and first underlayer 3.

Conversely, when a breakdown occurs between first underlayer 3 and drain electrode D located straight down from source electrode 2 and thus the avalanche current flows, the energy density of semiconductor device 12 can be reduced and the avalanche energy capacity can be increased.

According to semiconductor device 12 in the present embodiment, the avalanche current flows as a result of the breakdown occurring between first underlayer 3 and drain electrode D located straight down from source electrode S, as described above with reference to FIG. 2A and FIG. 2B. On the other hand, according to semiconductor device 13 in the comparative example, the avalanche current flows as a result of the breakdown occurring between source electrode S and drain electrode D via two-dimensional electron gas layer 8 located straight down from gate opening 9. Hence, semiconductor device 12 according to the present embodiment has a greater avalanche energy capacity than semiconductor device 13 according to the comparative example.

To be more specific, according to semiconductor device 12 in the present embodiment, the avalanche energy capacity is significantly enhanced.

[Relationship Among Avalanche Breakdown Voltage, Length of Bottom Surface of Source Electrode, and Length of Bottom Surface of Groove]

In semiconductor device 12 according to the present embodiment shown in FIG. 1, a length of bottom surface 11b of source opening 11 is longer than a length of bottom surface 10b of groove 10. Thus, an area of the p-n junction (the interface between first underlayer 3 and drift layer 2) through which the avalanche current passes can be increased. Hence, the energy density inside semiconductor device 12 can be reduced and the avalanche energy capacity can be further increased.

The following describes the relationship among the avalanche breakdown voltage, the length of the bottom surface of source electrode S (bottom surface 11b of source opening 11), and the length of bottom surface 10b of groove 10. The relationship is described in detail, with reference to FIG. 4A and FIG. 4B.

Figure 4A:
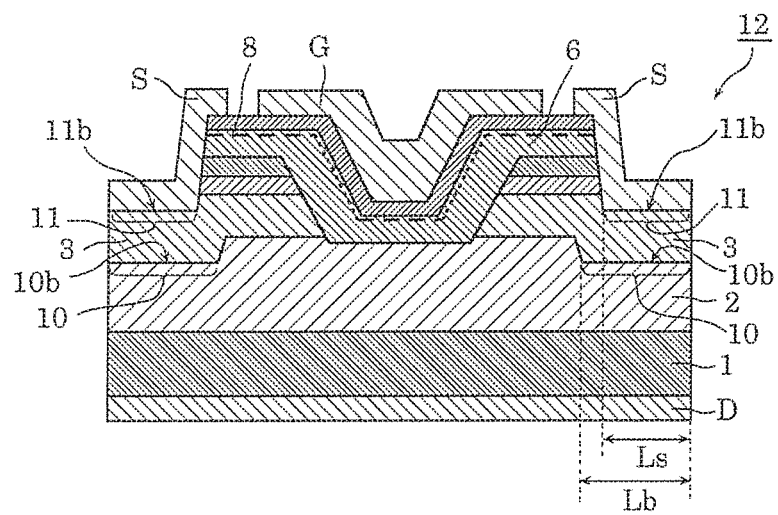
FIG. 4A is a cross-sectional diagram showing a relationship between a length of a bottom surface of a source electrode of the semiconductor device and a length of a bottom surface of a groove of the semiconductor device, according to Embodiment 1 of the present disclosure.
Figure 4B:
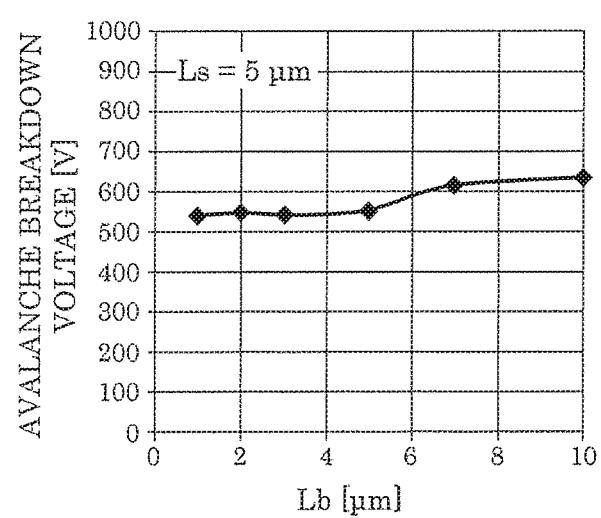
FIG. 4B is a diagram showing a relationship among avalanche breakdown voltage, the length of the bottom surface of the source electrode, and the length of the bottom surface of the groove, according to Embodiment 1 of the present disclosure.

FIG. 4A is a cross-sectional diagram of semiconductor device 12 according to the present embodiment, the diagram showing a relationship between length Ls of the bottom surface of source electrode S and length Ld of bottom surface 10b of groove 10. FIG. 4B is a diagram showing a relationship among the avalanche breakdown voltage, length Ls of the bottom surface of source electrode S, and length Ld of bottom surface 10b of groove 10, according to semiconductor device 12 in the present embodiment. In FIG. 4A and FIG. 4B, Ls indicates the length of the bottom surface of source electrode S, that is, the length of bottom surface 11b of source opening 11. Moreover, Lb indicates the length of bottom surface 10b of groove 10. It should be noted that, in FIG. 4A, some of the numerical values indicating the layers are omitted for the sake of brevity. Note also that Ls=5 μm, as an example.

Suppose that Lb is 5 μm or more, that is, length Lb of bottom surface 10b of groove 10 is longer than or equal to length Ls of the bottom surface of source electrode S. In this case, the avalanche breakdown voltage increases as can be seen from FIG. 4B. This is because longer length Lb of bottom surface 10b of groove 10 allows the area of the p-n junction between drift layer 2 and first underlayer 3 to be increased, thereby reducing the density of the avalanche current and thus increasing the avalanche energy capacity.

It can be understood from the above that semiconductor device 12 can increase the avalanche breakdown voltage by having length Ld of bottom surface 10b of groove 10 that is equal to or longer than length Ls of the bottom surface of source electrode S.

[Advantageous Effects Etc.]

As described thus far, semiconductor device 12 according to the present embodiment includes: substrate 1 which has the first main surface on one side and the second main surface on an opposite side, and is of the first conductivity type; drift layer 2 which is disposed on the first main surface of substrate 1, has groove 10 in a partial region, and includes the first nitride semiconductor that is of the first conductivity type; first underlayer 3 which is disposed above drift layer 2; gate opening 9 which is disposed separately from groove 10 in plan view and penetrates first underlayer 3 to reach drift layer 2; first regrown layer 6 which is disposed to cover gate opening 9 and includes the second nitride semiconductor; second regrown layer 7 which is disposed above first regrown layer 6 and includes the third nitride semiconductor having a larger band gap than the second nitride semiconductor; two-dimensional electron gas layer (channel layer) 8 which is disposed inside first regrown layer 6 and near the interface between first regrown layer 6 and second regrown layer 7; source opening 11 which penetrates first regrown layer 6 and second regrown layer 7 to reach first underlayer 3; gate electrode G which is disposed above second regrown layer 7 at the position corresponding to the position of gate opening 9; source electrode S which is disposed to cover source opening 11, located separately from gate electrode G, and in contact with two-dimensional electron gas layer 8 and first underlayer 3; and drain electrode D which is disposed on the second main surface of substrate 1. Bottom surface 10b of groove 10 is closer to the first main surface of substrate 1 than bottom surface 9b of gate opening 9.

With this configuration, the distance from bottom surface 10b of groove 10 located straight down from source electrode S (that is, the distance from the bottom surface of first underlayer 3) to substrate 1 is shorter than the distance from bottom surface 9b of gate opening 9 to substrate 1. On this account, the avalanche current can pass through a p-n diode formed from first underlayer 3 and drift layer 2 located straight down from source electrode S, without passing through two-dimensional electron gas layer 8. Thus, when semiconductor device 12 includes an inductive load, energy stored in the inductive load can consumed in an extremely larger volume than a volume of two-dimensional electron gas layer 8. As a result, the energy density can be significantly reduced. Hence, the present embodiment can provide semiconductor device 12 which has a high avalanche energy capacity and a high breakdown voltage.

Moreover, semiconductor device 12 according to the present embodiment includes first underlayer 3 which includes the fifth nitride semiconductor that is of the second conductivity type opposite to the first conductivity type, for example. To be more specific, first underlayer 3 is formed using a p-type nitride semiconductor.

With this, the p-n junction diode can be formed from first underlayer 3 and drift layer 2. Thus, the breakdown voltage of semiconductor device 12 can be increased.

It should be noted that each thickness of the layers from drift layer 2 to second regrown layer 7 is not limited to the thickness described above in the present embodiment. The thickness can be set as appropriate within a range by which semiconductor device 12 having a high avalanche energy capacity can be obtained. Moreover, Ls is 5 μm in the present embodiment. However, the length is not limited to this and can be set as appropriate within a range by which semiconductor device 12 having a high avalanche energy capacity can be obtained.

Furthermore, second regrown layer 7 in the present embodiment is described as having, for example, a laminated structure that includes: the first layer having the thickness of 1 nm and formed from AlN; and the second layer having the thickness of 50 nm and formed from AlGaN. However, this is not intended to be limiting. Even when second regrown layer 7 includes only a single layer formed from AlGaN, two-dimensional electron gas layer 8 is formed and thus the same advantageous effect as above can be achieved.

Variation 1 of Embodiment 1

Hereinafter, Variation 1 of Embodiment 1 is described, with reference to FIG. 5.

Figure 5:
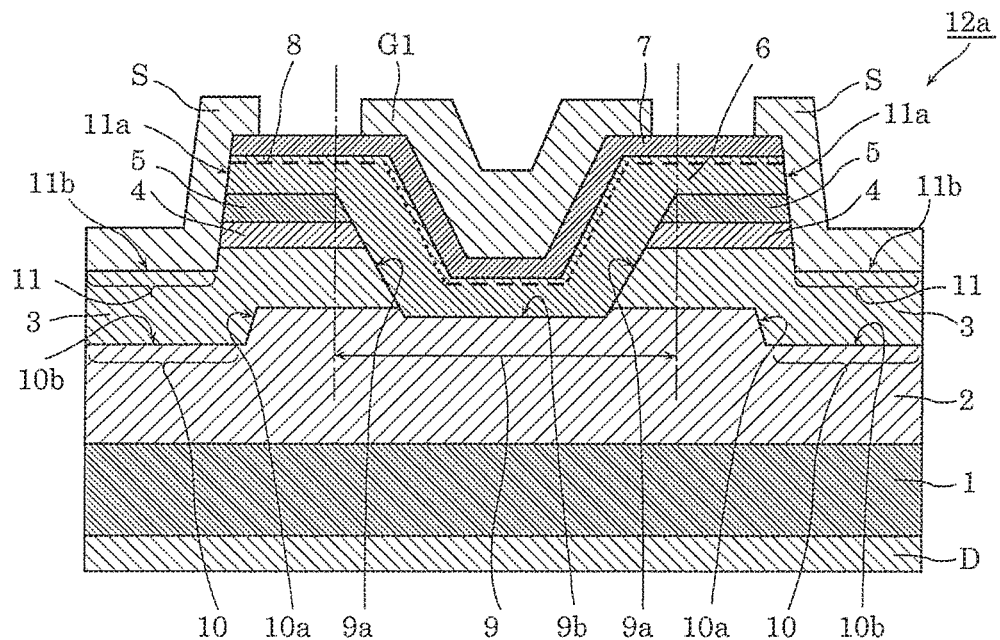
FIG. 5 is a cross-sectional diagram of a semiconductor device according to Variation 1 of Embodiment 1 of the present disclosure.

FIG. 5 is a cross-sectional diagram of semiconductor device 12a according to the present variation. As shown in FIG. 5, semiconductor device 12a according to the present variation is different from semiconductor device 12 according to Embodiment 1 in that gate electrode G1 is provided instead of gate electrode G. The following mainly describes differences between Variation 1 and Embodiment 1, and thus similarities between Variation 1 and Embodiment 1 may be omitted or simplified.

In the present variation, both ends of gate electrode G1 (gate ends or ends of gate electrode G) included in semiconductor device 12a are positioned on an inner side of gate opening 9. In this case, a threshold of semiconductor device 12a can be determined based only on a part formed along side surface 9a of gate opening 9 (based only on a sidewall).

With this configuration, semiconductor device 12a having a high avalanche energy capacity can be obtained. In addition, a carrier density of a flat region (a region along bottom surface 9b of gate opening 9) can be increased, thereby reducing an on-resistance of semiconductor device 12a.

Variation 2

Hereinafter, Variation 2 of Embodiment 1 is described, with reference to FIG. 6.

Figure 6:
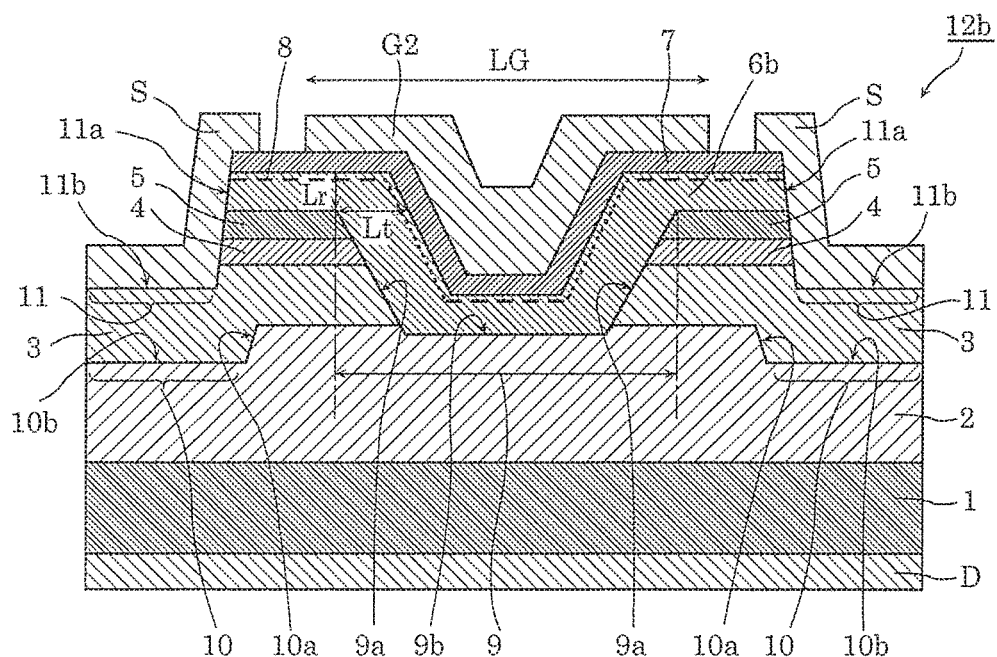
FIG. 6 is a cross-sectional diagram of a semiconductor device according to Variation 2 of Embodiment 1 of the present disclosure.

FIG. 6 is a cross-sectional diagram of semiconductor device 12b according to the present variation. As shown in FIG. 6, semiconductor device 12b according to the present variation is different from semiconductor device 12 according to Embodiment 1 in that gate electrode G2 and first regrown layer 6b are provided instead of gate electrode G and first regrown layer 6, respectively. The following mainly describes differences between Variation 2 and Embodiment 1, and thus similarities between Variation 2 and Embodiment 1 may be omitted or simplified.

In the present variation, gate ends of gate electrode G2 are positioned on an outer side of gate opening 9. To be more specific, width LG of gate electrode G2 is greater than a width of gate opening 9. It should be noted that, in the cross section shown in FIG. 6, the width of gate opening 9 is a distance between top ends of side surface 9a in a horizontal direction (a direction parallel to the main surface of substrate 1). In this case, a threshold of semiconductor device 12b is determined based on either a region along side surface 9a of gate opening 9 (i.e., the sidewall) or a region along bottom surface 9b of gate opening 9 the (i.e., the flat region), whichever has a greater threshold.

In semiconductor device 12b according to the present variation, layer thickness Lt of first regrown layer 6b in a direction parallel to the first main surface of substrate 1 is greater than layer thickness Lr of first regrown layer 6b in a direction perpendicular to the first main surface of substrate 1. More specifically, Lr<Lt. Hence, the threshold of semiconductor device 12b is determined based on the flat region of gate opening 9.

With this, a distance between first underlayer 3 having p-type conductivity and two-dimensional electron gas layer 8 can be increased. This can suppress depletion of two-dimensional electron gas layer 8 on the sidewall of gate opening 9 caused by influence of first underlayer 3. Thus, a threshold of the channel on the sidewall of gate opening 9 can be reduced.

In this way, the threshold of semiconductor device 12b according to the present variation can be determined based on the flat region of gate opening 9.

Moreover, the present variation can provide semiconductor device 12b having a high avalanche energy capacity as well as having two advantages as follows.

The first advantage is that a decrease in carrier density of the channel can be suppressed, since the depletion of two-dimensional electron gas layer 8 can be reduced on the sidewall of gate opening 9. With this, a narrowing of the depletion layer from first underlayer 3, which is of p-type, can be suppressed and thus the on-resistance of semiconductor device 12b can be reduced.

The second advantage is that a depth of the opening can be reduced in a process after first regrown layer 6b is formed, since layer thickness Lr of first regrown layer 6b in the direction perpendicular to the first main surface of substrate 1 is small. A smaller opening depth allows process time to be reduced, and coverage by gate electrode G2 can be achieved excellently.

More specifically, according to the present variation, the configuration in which Lr<Lt makes the process for semiconductor device 12b easy and also allows the on-resistance of semiconductor device 12b to be reduced.

Embodiment 2

Hereinafter, Embodiment 2 is described.

Figure 7:
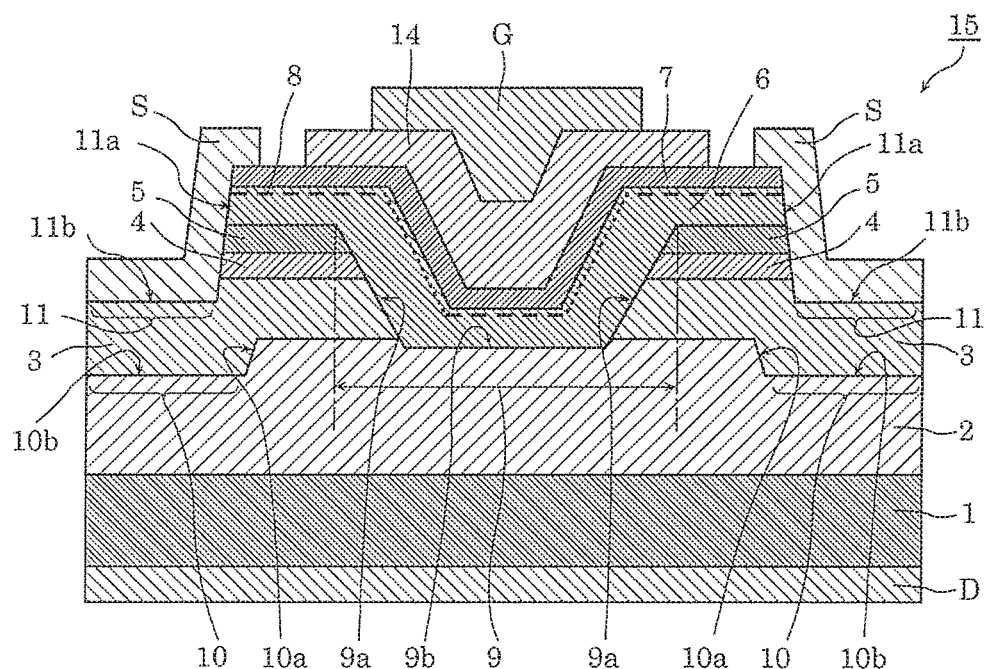
FIG. 7 is a cross-sectional diagram of a semiconductor device according to Embodiment 2 of the present disclosure.

FIG. 7 is a cross-sectional diagram of semiconductor device 15 according to the present embodiment. As shown in FIG. 7, semiconductor device 15 according to the present embodiment is different from semiconductor device 12 according to Embodiment 1 in that third regrown layer 14 is disposed between gate electrode G and second regrown layer 7. The following mainly describes differences between Embodiment 2 and Embodiment 1, and thus similarities between Embodiment 2 and Embodiment 1 may be omitted or simplified.

Third regrown layer 14 is disposed between second regrown layer (electron supply layer) 7 and gate electrode G. Third regrown layer 14 is an example of a control layer formed from a fourth nitride semiconductor which is of the second conductivity type opposite to the first conductivity type. More specifically, third regrown layer 14 is formed from AlGaN having the p-type conductivity. With third regrown layer 14 formed from p-type AlGaN, semiconductor device 15 can increase potential energy of two-dimensional electron gas layer 8 which is the channel located straight down from third regrown layer 14. On this account, a threshold of semiconductor device 15 can be increased, and semiconductor device 15 can achieve a normally-off operation. Third regrown layer 14 can increase the threshold of semiconductor device 15. Thus, in a sense of controlling the threshold, third regrown layer 14 is called a control layer.

It should be noted that third regrown layer 14 is not limited to being formed from p-type AlGaN and may be formed using a different p-type nitride semiconductor, such as p-type GaN or p-type AlGaInN. Even when the different p-type nitride semiconductor is used, the potential energy of two-dimensional electron gas layer 8 located straight down from third regrown layer 14 can be increased.

Even using an insulation film, such as a SiN or $SiO_2$ film, instead of p-type AlGaN to form third regrown layer 14, the potential energy of two-dimensional electron gas layer 8 located straight down from third regrown layer 14 can be increased. More specifically, semiconductor device 15 may include an insulation control layer disposed between second regrown layer 7 and gate electrode G, instead of third regrown layer 14.

Thus, the usage of a p-type nitride semiconductor or an insulation film for third regrown layer 14 allows the threshold of semiconductor device 15 to be increased and achieves a normally-off operation of semiconductor device 15. In short, third regrown layer 14 may be formed using any material that has the effect of increasing the potential energy of the channel.

As described thus far, semiconductor device 15 according to the present embodiment further includes third regrown layer 14. Third regrown layer 14 is disposed between second regrown layer 7 and gate electrode G and formed from the fourth nitride semiconductor which is of the second conductivity type opposite to the first conductivity type.

With this, the threshold of semiconductor device 15 can be increased. Hence, the normally-off operation of semiconductor device 15 can be achieved.

It should be obvious that the present embodiment can provide semiconductor device 15 which has a high avalanche energy capacity.

As in the case of semiconductor device 12a according to Variation 1 of Embodiment 1, semiconductor device 15 may also include gate electrode G which has both ends positioned on the inner side of gate opening 9. Moreover, both ends of third regrown layer 14 may be positioned on the inner side of gate opening 9. With this, the threshold of semiconductor device 15 can be determined based only on the sidewall of gate opening 9.

Embodiment 3

Hereinafter, Embodiment 3 is described.

Figure 8:
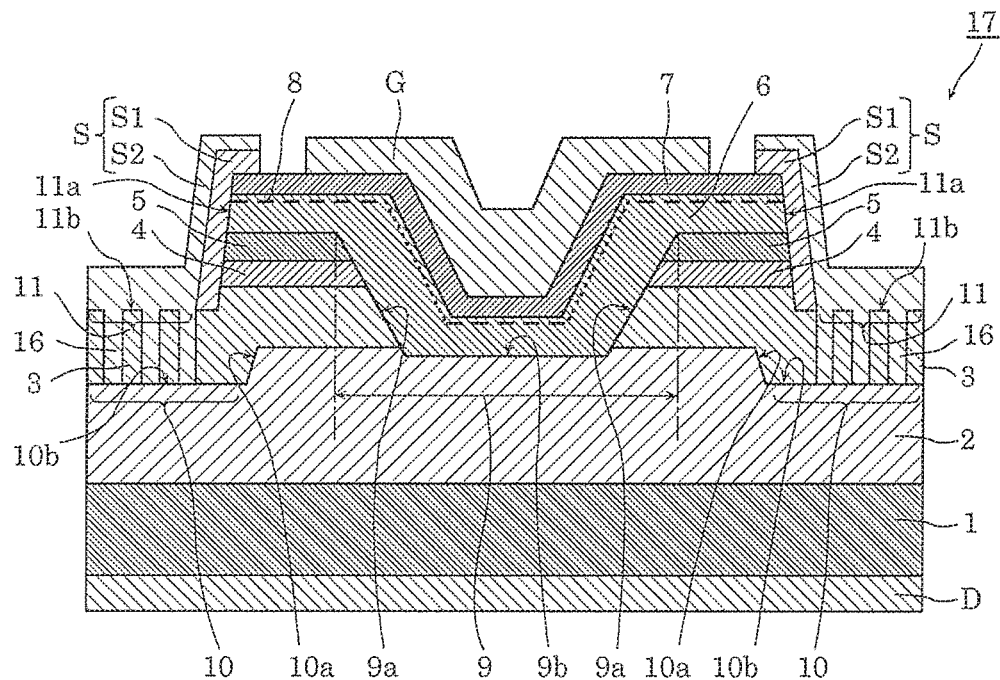
FIG. 8 is a cross-sectional diagram of a semiconductor device according to Embodiment 3 of the present disclosure.

FIG. 8 is a cross-sectional diagram of semiconductor device 17 according to the present embodiment. As shown in FIG. 8, semiconductor device 17 according to the present embodiment is different from semiconductor device 12 according to Embodiment 1 in that source electrode S includes first source electrode S1 and second source electrode S2 and in that through hole 16 is formed in first underlayer 3. Except for these differences, semiconductor device 17 according to Embodiment 3 is identical to semiconductor device 12 according to Embodiment 1. The following mainly describes the differences between Embodiment 3 and Embodiment 1, and thus similarities between Embodiment 3 and Embodiment 1 may be omitted or simplified.

In the present embodiment shown in FIG. 8, first underlayer 3 includes a plurality of through holes 16. It should be noted that the number of through holes 16 may be one. Each of the plurality of through holes 16 penetrates first underlayer 3 from bottom surface 11b of source opening 11 to reach drift layer 2. To be more specific, the plurality of through holes 16 are formed on the inner side of groove 10 and on the inner side of source opening 11, in plan view. Each of the plurality of through holes 16 is filled with second surface electrode S2.

Source electrode S has a multi-layer structure which includes first source electrode S1 and second source electrode S2. First source electrode S1 is in contact with two-dimensional electron gas layer (channel layer) 8. More specifically, first source electrode S1 is formed along side surface 11a of source opening 11, as shown in FIG. 8. First source electrode S is in contact with each of end surfaces of second regrown layer 7, first regrown layer 6, second underlayer 5, and block layer 4.

First source electrode S1 is formed using a conducting material, such as metal. Examples of the material of first source electrode S1 include a metal that forms an ohmic contact with an n-type nitride semiconductor, such as Ti/Al. For example, first source electrode S1 is formed by patterning a conductive film that is formed by sputtering or evaporation.

Second source electrode S2 is in contact with drift layer 2. To be more specific, second source electrode S2 is disposed to fill through hole 16 and in contact with drift layer 2 via through hole 16. Second source electrode S2 is further in contact with first underlayer 3. To be more specific, second electrode S2 is in contact with first underlayer 3 via bottom surface 11b of source opening 11 and through hole 16. Furthermore, first source electrode S1 and second source electrode S2 are electrically connected to each other.

Second source electrode S2 is formed using a conducting material, such as metal. In the present embodiment, second source electrode S2 is formed using a material different from the material of first source electrode S1. For example, second source electrode S2 includes Pd, Ni, Au, and Pt and forms an ohmic contact with first, underlayer 3. Second source electrode S2 forms a Schottky connection with drift layer 2. For example, second source electrode S2 is formed by patterning a conductive film that is formed by sputtering or evaporation.

As described thus far, semiconductor device 17 according to the present embodiment includes first underlayer 3 having through hole 16 that penetrates first underlayer 3 from bottom surface 11b of source opening 11 to reach drift layer 2. Moreover, semiconductor device 17 includes source electrode S which is in contact with drift layer 2 via through hole 16.

With this configuration, semiconductor device 17 according to the present embodiment includes a diode which is formed on bottom surface 10b of groove 10 between drain electrode D and source electrode S. This diode includes both; a p-n junction formed of first underlayer 3 which is p-type and drift layer 2 which is n-type; and a Schottky junction formed of second source electrode S2 and drift layer 2.

With this, when a forward current passes through the diode formed between drain electrode D and source electrode S, an operating voltage can be reduced. Moreover, when a reverse current passes through the diode, the breakdown voltage can be increased.

Furthermore, semiconductor device 17 includes source electrode S having first source electrode S1 and second source electrode S2, for example. First source electrode S1 is in contact with two-dimensional electron gas layer 8. Second source electrode S2 is formed using the material different from the material of first source electrode S and is in contact with drift layer 2. To be more specific, semiconductor device 17 includes second source electrode S2 which is in contact with first underlayer 3.

In this way, semiconductor device 17 according to the present embodiment includes a source electrode (first source electrode S1) of the transistor and an anode electrode (second source electrode S2) of the diode. These source and anode electrodes are formed using two different types of metal. More specifically, first source electrode S1 is formed, using the metal which forms an ohmic contact with an n-type nitride semiconductor, and second source electrode S2 (anode electrode) is formed using the metal which forms an ohmic contact with first underlayer 3 that is p-type.

With this, semiconductor device 17 includes first electrode S1 which can achieve low resistance by forming the ohmic contact with the channel (two-dimensional electron gas layer 8). At the same time, first electrode S1 can form a contact with first underlayer 3 with a low contact resistance. As a result, the depletion layer from first underlayer 3 can be efficiently extended and thus the high breakdown voltage of semiconductor device 17 can be increased. Hence, a higher breakdown voltage of semiconductor device 17 can be achieved.

It should be noted that the same advantageous effect as that of semiconductor device 17 can be achieved, by each of the semiconductor devices, other than semiconductor device 17, according to Variation 1, Variation 2, and Variation 3 described below. These variations of the present embodiment are described with reference to the drawings. The following mainly describes differences between Variations and Embodiment 3, and thus similarities between Variations and Embodiment 3 may be omitted or simplified.

Variation 1 of Embodiment 3

Hereinafter, Variation 1 of Embodiment 3 is described with reference to FIG. 9.

Figure 9:
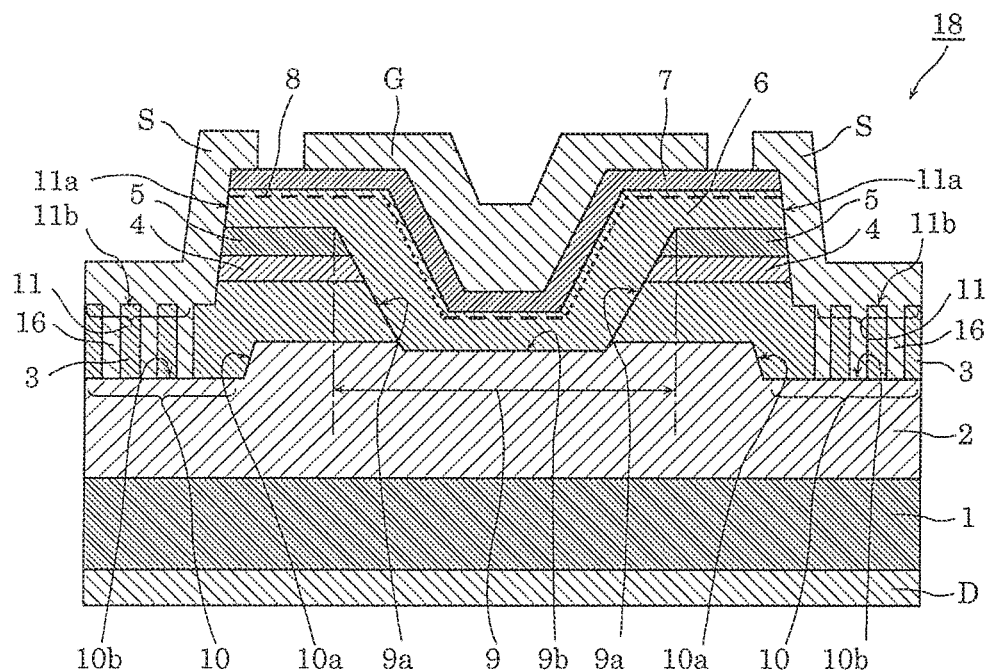
FIG. 9 is a cross-sectional diagram of a semiconductor device according to Variation 1 of Embodiment 3 of the present disclosure.

FIG. 9 is a cross-sectional diagram of semiconductor device 18 according to the present variation. Semiconductor device 18 according to the present variation is different from semiconductor device 17 according to Embodiment 3 in that first source electrode S1 and second source electrode S2 are formed using the same material. More specifically, as in Embodiment 1, source electrode S is formed as one piece as shown in FIG. 9 using one material. To be more specific, source electrode S (first source electrode S1 and second source electrode S2) is formed using Ti/Al. With this configuration, source electrode S can be formed in one process. Thus, the processing can be reduced and semiconductor device 18 can be manufactured at a low cost.

Variation 2 of Embodiment 3

Hereinafter, Variation 2 of Embodiment 3 is described with reference to FIG. 10.

Figure 10:
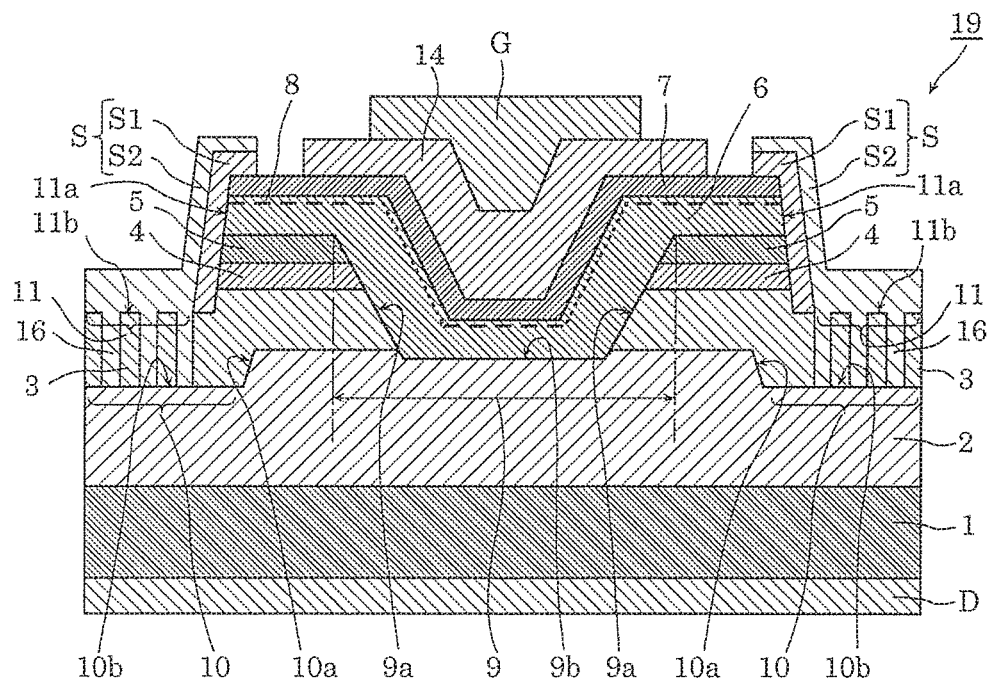
FIG. 10 is a cross-sectional diagram of a semiconductor device according to Variation 2 of Embodiment 3 of the present disclosure.

FIG. 10 is a cross-sectional diagram of semiconductor device 19 according to the present variation. Semiconductor device 19 according to the present variation is different from semiconductor device 17 according to Embodiment 3 in that third regrown layer 14 is disposed between gate electrode G and second regrown layer 7. Third regrown layer 14 is identical to third regrown layer 14 included in semiconductor device 15 according to Embodiment 2, and is formed from, for example, p-type AlGaN.

In the present variation, the p-type nitride semiconductor is used as third regrown layer 14. This allows a threshold of semiconductor device 19 to be increased and achieves a normally-off operation of semiconductor device 19.

Variation 3 of Embodiment 3

Hereinafter, Variation 3 of Embodiment 3 is described, with reference to FIG. 11.

Figure 11:
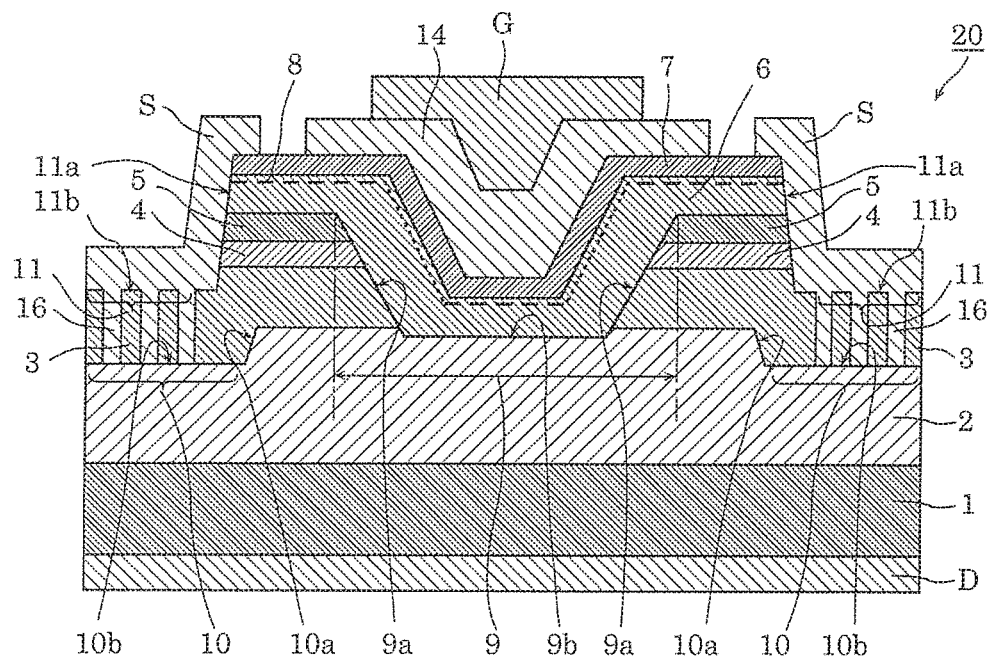
FIG. 11 is a cross-sectional diagram of a semiconductor device according to Variation 3 of Embodiment 3 of the present disclosure.

FIG. 11 is a cross-sectional diagram of semiconductor device 20 according to the present variation. Semiconductor device 20 according to the present variation is different from semiconductor device 19 according to Variation 2 of Embodiment 3 in that first source electrode S1 and second source electrode S2 are formed using the same material. More specifically, as in Embodiment 1, source electrode S is formed as one piece as shown in FIG. 11 using one material. The present variation corresponds to a combination of Variation 1 and Variation 2 of Embodiment 3.

It should be noted that although each of semiconductor devices 17 to 20 according to Embodiment 3 and Variations of Embodiment 3 may include only one through hole 16, at least two through holes 16 are formed. With this, it is easier for the depletion layer to extend from first underlayer 3 (p-type) divided by through holes 16. Thus, leakage current does not increase and a high breakdown voltage can be obtained. Note that a width of through hole 16 is, for example, 0.5 μm to 10 μm inclusive, or may be preferably 1 μm to 5 μm inclusive. Furthermore, a width of first underlayer 3 formed discretely because of the plurality of through holes 16 is, for example, 0.5 μm to 10 μm inclusive or may be preferably 1 μm to 5 μm inclusive.

Embodiment 4

Hereinafter, Embodiment 4 is described.

Figure 12:
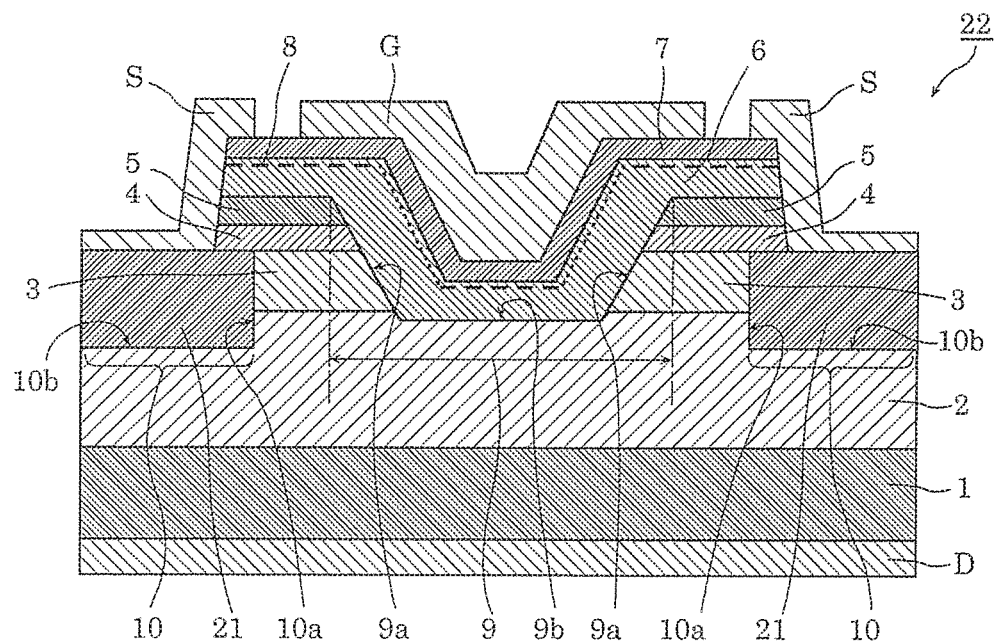
FIG. 12 is a cross-sectional diagram of a semiconductor device according to Embodiment 4 of the present disclosure.

FIG. 12 is a cross-sectional diagram of semiconductor device 22 according to the present embodiment. As shown in FIG. 12, semiconductor device 22 according to the present embodiment is different from semiconductor device 12 according to Embodiment 1 in that implantation layer 21 formed by ion implantation is provided. The following mainly describes differences between Embodiment 4 and Embodiment 1, and thus similarities between Embodiment 4 and Embodiment 1 may be omitted or simplified.

Implantation layer 21 is formed by implanting ion in a part of first underlayer 3 and a part of drift layer 2 which are located straight down from source electrode S. For example, implantation layer 21 is formed by implanting ion in a part of first underlayer 3 to a depth to reach drift layer 2, the part being located straight; down from source electrode S. Implantation layer 21 has the p-type conductivity.

More specifically, after forming the layers from drift layer 2 to second underlayer 5 sequentially on substrate 1 by crystal growth, ion implantation is performed on a predetermined region (a region located straight down from source electrode S) of first underlayer 3. Here, ion implantation may be performed after drift layer 2 and first underlayer 3 are formed by crystal growth. Then, after this, block layer 4 and second underlayer 5 may be formed. Moreover, ion implantation is performed before gate opening 9 is formed in the present embodiment. However, ion implantation may be performed after gate opening 9 is formed.

In the present embodiment, groove 10 is formed in drift layer 2 by forming implantation layer 21. More specifically, groove 10 is formed by implanting ion in a partial region of drift layer 2 to a predetermined depth, instead of removing the partial region of drift layer 2 to the predetermined depth. To be more specific, an interface between a region in which ion is implanted (i.e., implantation layer 21) and a region in which ion is not implanted (i.e., drift layer 2) corresponds to side surface 10a and bottom surface 10b of groove 10.

Thus, an end of the ion-implanted region of implantation layer 21 corresponds to bottom surface 10b of groove 10. This end is closer to the first main surface of substrate 1 than bottom surface 9b of gate opening 9, or more specifically, than the interface located straight down from gate electrode G between drift layer 2 and first regrown layer 6. It should be noted that the ion type used in the ion implantation is not particularly limited and may be any p-type dopant element. For example, Mg, Fe, or C may be used.

As described above, semiconductor device 22 according to the present embodiment includes first underlayer 3 in which the part located straight down from source electrode S is ion-implanted.

With this, following the crystal growth of drift layer 2, first underlayer 3, block layer 4, and second underlayer 5 can be formed sequentially by crystal growth. This can reduce the number of crystal regrowth processes to one in which the subsequent members including first regrown layer 6 are formed. Hence, semiconductor device 22 can be manufactured at a low cost.

Furthermore, it should be obvious that semiconductor device 22 having a high avalanche energy capacity can be obtained.

Variation of Embodiment 4

Hereinafter, Variation of Embodiment 4 is described with reference to FIG. 13.

Figure 13:
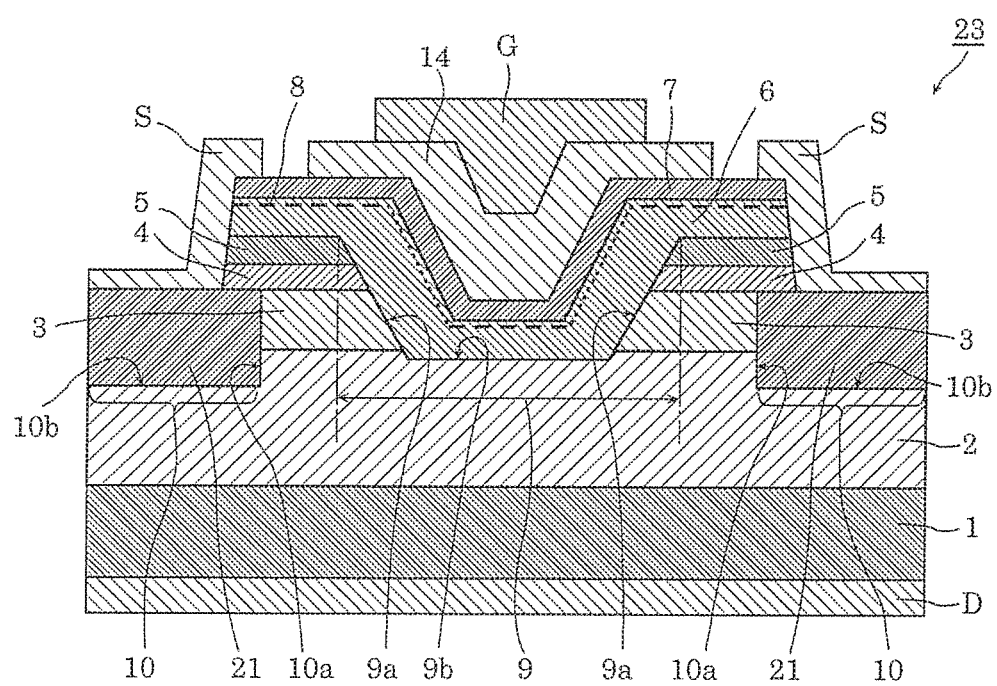
FIG. 13 is a cross-sectional diagram of a semiconductor device according to Variation of Embodiment 4 of the present disclosure.

FIG. 13 is a cross-sectional diagram of semiconductor device 23 according to the present variation. Semiconductor device 23 according to the present variation is different from semiconductor device 22 according Embodiment 4 in that third regrown layer 14 is disposed between gate electrode G and second regrown layer 7. Third regrown layer 14 is identical to third regrown layer 14 included in semiconductor device 15 according to Embodiment 2, and is formed from, for example, p-type AlGaN.

In the present variation, the p-type nitride semiconductor is used as third regrown layer 14. This allows a threshold of semiconductor device 23 to be increased and achieves a normally-off operation of semiconductor device 23.

Furthermore, it should be obvious that semiconductor device 23 having a high avalanche energy capacity can be obtained.

Embodiment 5

Figure 14:
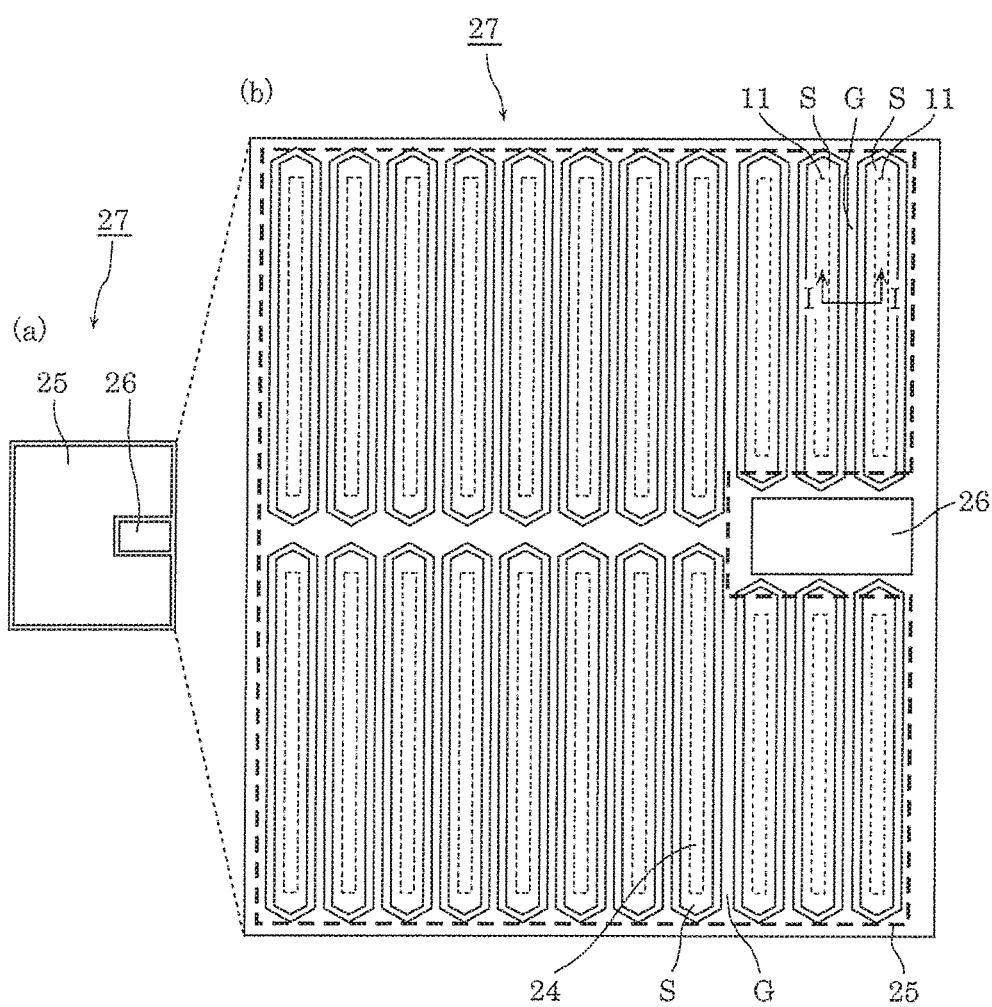
FIG. 14 is a diagram showing a top view of a semiconductor device according to Embodiment 5 of the present disclosure and also showing an enlarged view of the top view.

Hereinafter, semiconductor device 27 according to Embodiment 5 of the present disclosure is described with reference to FIG. 14. FIG. 14 is a diagram showing a top view of semiconductor device 27 according to the present embodiment and also showing an enlarged view of the top view.

Semiconductor device 27 shown in FIG. 14 is a single chip in which more than one semiconductor device 12 according to Embodiment 1 is arranged and integrated. As shown in FIG. 14, semiconductor device 27 includes a plurality of semiconductor devices 12, source pad 25, gate pad 26, and drain pad (not illustrated).

In (a) of FIG. 14, an arrangement of source pad 25 and gate pad 26 on an upper surface of semiconductor device 27 is shown. In (b) of FIG. 14, an enlarged diagram of (a) in perspective view of source pad 25 is shown. The drain pad (not illustrated) is formed on a backside surface of semiconductor device 27. A cross-sectional view taken along line I-I in (b) of FIG. 14 corresponds to the cross-sectional view of semiconductor device 12 shown in FIG. 1.

As shown in (a) and (b) of FIG. 14, source pad 25 is formed in an approximately laterally-facing U-shape in plan view. Moreover, as shown in (b) of FIG. 14, a plurality of contact holes 24 are disposed in a range covered by source pad 25. Contact hole 24 includes source electrode S and is electrically conductive with source pad 25.

Furthermore, gate pad 26 is disposed so that source pad 25 sandwiches both sides of gate pad 26. Gate pad 26 is electrically conductive with gate electrode G. In (b) of FIG. 14, source pad 25 is indicated by a thick dashed line.

Although not illustrated, the drain pad is electrically conductive with drain electrode D.

It should be noted that source electrode S, gate electrode G, and source opening 11 (indicated by a dashed line) are elongated in a vertical direction in (b) of FIG. 14 in the plane of paper. More specifically, a plan layout of source electrode S, gate electrode G, and source opening 11 is a so-called finger layout. A longitudinal direction of source electrode S, gate electrode G, and source opening 11 (i.e., the direction from bottom to top in (a) and (b) of FIG. 14 in the plane of paper) refers to a <11-20> direction. Note that "– (minus)" in the parentheses < > indicates a bar.

Variation of Embodiment 5

Figure 15:
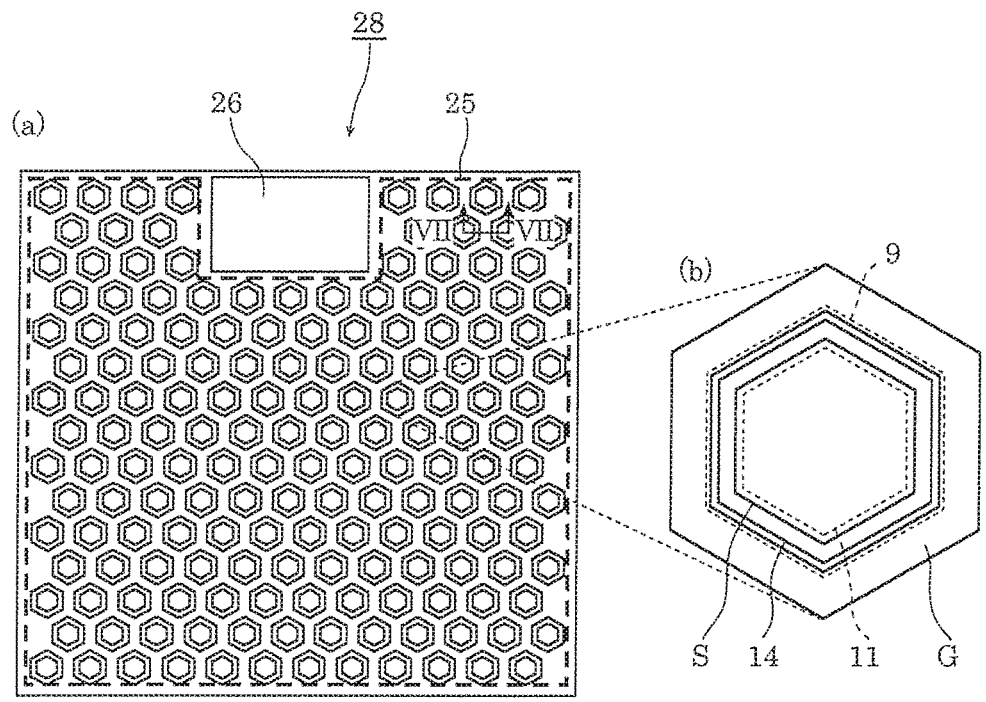
FIG. 15 is a diagram showing a top view of a semiconductor device according to Variation of Embodiment 5 of the present disclosure and also showing a partially enlarged view of the top view.
Figure 16:
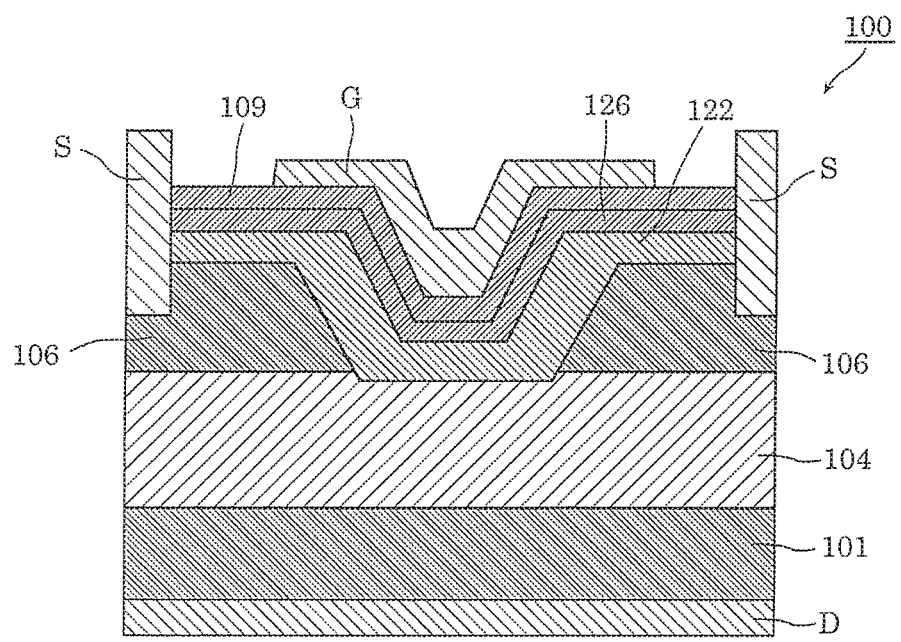
FIG. 16 is a cross-sectional diagram of a conventional semiconductor device.

Hereinafter, semiconductor device 28 according to Variation of Embodiment 5 of the present disclosure is described with reference to FIG. 15. FIG. 15 is a diagram showing a top view of semiconductor device 28 according to the present variation and also showing a partially enlarged view of the top view.

Semiconductor device 28 is a single chip in which more than one semiconductor device 15 according to Embodiment 2 is arranged and integrated. As shown in FIG. 15, semiconductor device 28 includes a plurality of semiconductor devices 15, source pad 25, gate pad 26, and drain pad (not illustrated).

In (a) of FIG. 15, an arrangement of source pad 26 and gate pad 26 on an upper surface of semiconductor device 28 is shown. In (a) of FIG. 15, a perspective view of source pad 25 is shown. In (b) of FIG. 15, a partially enlarged view of (a) is shown. The drain pad (not illustrated) is formed on a backside surface of semiconductor device 28. In (a) of FIG. 15, source pad 25 is indicated by a thick dashed line. A cross-sectional view taken along line in (a) of FIG. 15 corresponds to the cross-sectional view of semiconductor device 15 shown in FIG. 7.

Semiconductor device 28 according to the present variation is different from semiconductor device 27 according to Embodiment 5 in that shapes of source electrode S and gate electrode G are different from those in Embodiment 5. To be more specific, semiconductor device 28 includes source electrode S and gate electrode G each of which is hexagonal. As shown in (b) of FIG. 15, gate electrode G, gate opening 9 (indicated by a dashed line), and third regrown layer 14 are disposed to encompass source electrode S and source opening 11 (indicated by the dashed line) to form one cell 29.

As shown in (a) of FIG. 15, a configuration structure of cell 29 is a so-called closest-packed structure. The direction which is from bottom to top in (a) and (b) of FIG. 15 in the plane of paper and along a side of the hexagon refers to the <11-20> direction.

Note that source electrode S is electrically conductive with source pad 25, and that gate electrode G is electrically conductive with gate pad 26. Moreover, the drain pad (not illustrated) is electrically conductive with drain electrode D.

According to the present embodiment and the present variation, the cross-sectional view taken along line I-I in (b) of FIG. 14 corresponds to the cross-sectional view of semiconductor device 12 shown in FIG. 1, as described above. However, the cross-sectional view taken along line I-I may correspond to the cross-sectional view of any of semiconductor device 15, semiconductor devices 17 to 20, and semiconductor devices 22 and 23, other than semiconductor device 12. Moreover, the cross-sectional view taken along line VII-VII in (a) of FIG. 15 corresponds to the cross-sectional view of semiconductor device 15 shown in FIG. 7, as described above. However, the cross-sectional view taken along line VII-VII may correspond to the cross-sectional view of any of semiconductor device 12, semiconductor devices 17 to 20, and semiconductor devices 22 and 23, other than semiconductor device 15.

In the embodiment described above, the longitudinal direction of source electrode S, gate electrode G, and source opening 11 refers to the <11-20> direction. However, this longitudinal direction may refer to a <1-100> direction.

Moreover, in the embodiment described above, substrate 1 has plane orientation in the [0001] plane. However, the plane is not limited to the [0001] plane and may be any plane that has the polarity.

Others

Although the semiconductor device according to an aspect or aspects of the present disclosure has been described by way of Embodiments and Variations above, it should be obvious that the present disclosure is not limited to Embodiments and Variations described above.

For example, the first conductivity type is described as the n, $n^+$, or $n^-$ type and the second conductivity type is described as the p, $p^+$, or $p^-$ type in the above embodiments and variation. However, the present disclosure is not limited to this. The first conductivity type may be the p, $p^+$, or $p^-$ type and the second conductivity type may be the n, $n^+$, or $n^-$ type.

Other embodiments implemented through various changes and modifications conceived by a person of ordinary skill in the art or through a combination of arbitrary structural elements or functions in different embodiments and variation described above may be included in the scope in an aspect or aspects according to the present disclosure, unless such changes, modification, and combination depart from the scope of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor device according to the present disclosure is useful as, for instance, a power device used in, for example, a power supply circuit of consumer equipment, such as a television set.

What is claimed is:

1. A semiconductor device, comprising:
   a substrate which has a first main surface on one side and a second main surface on an opposite side, and which is of a first conductivity type;
   a drift layer which is disposed on the first main surface of the substrate, has a groove in a partial region, and includes a first nitride semiconductor that is of the first conductivity type;
   an underlayer which is disposed above the drift layer;
   a first opening which is disposed separately from the groove in plan view and penetrates the underlayer to reach the drift layer;
   an electron transit layer which is disposed to cover the first opening and includes a second nitride semiconductor;
   an electron supply layer which is disposed above the electron transit layer and includes a third nitride semiconductor having a larger band gap than the second nitride semiconductor;
   a channel layer which is disposed inside the electron transit layer and near an interface between the electron transit layer and the electron supply layer;
   a second opening which penetrates the electron supply layer and the electron transit layer to reach the underlayer;
   a gate electrode which is disposed above the electron supply layer at a position corresponding to a position of the first opening;
   a source electrode which is disposed to cover the second opening, located separately from the gate electrode, and in contact with the channel layer and the underlayer; and
   a drain electrode which is disposed on the second main surface of the substrate,
   wherein a bottom surface of the groove is closer to the first main surface of the substrate than a bottom surface of the first opening.

2. The semiconductor device according to claim 1, further comprising:
   a control layer which is disposed between the electron supply layer and the gate electrode and includes a fourth nitride semiconductor that is of a second conductivity type opposite to the first conductivity type.

3. The semiconductor device according to claim 1,
   wherein the underlayer includes a fifth nitride semiconductor which is of a second conductivity type opposite to the first conductivity type.

4. The semiconductor device according to claim 1,
   wherein the underlayer has a through hole which penetrates the underlayer from a bottom surface of the second opening to reach the drift layer, and
   the source electrode is further in contact with the drift layer via the through hole.

5. The semiconductor device according to claim 4,
   wherein the source electrode includes:
   a first source electrode which is in contact with the channel layer; and
   a second source electrode which is formed using a material different from a material used for forming the first source electrode, and which is in contact with the drift layer.

6. The semiconductor device according to claim 5,
   wherein the second source electrode is in contact with the underlayer.

7. The semiconductor device according to claim 1,
   wherein the underlayer includes an ion-implanted part which is located straight down from the source electrode.

* * * * *